(12) United States Patent
Kim et al.

(10) Patent No.: US 11,301,073 B2
(45) Date of Patent: Apr. 12, 2022

(54) TOUCH DISPLAY APPARATUS HAVING A LIGHT-EMITTING DEVICE AND A TOUCH STRUCTURE

(71) Applicant: LG Display Co., Ltd., Seoul (KR)

(72) Inventors: Sung-Woo Kim, Seoul (KR); Young-Bok Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/116,785

(22) Filed: Dec. 9, 2020

(65) Prior Publication Data

US 2021/0200358 A1 Jul. 1, 2021

(30) Foreign Application Priority Data

Dec. 27, 2019 (KR) .................. 10-2019-0176475

(51) Int. Cl.
*G06F 3/041* (2006.01)
*G06F 3/044* (2006.01)
(52) U.S. Cl.
CPC .......... *G06F 3/0412* (2013.01); *G06F 3/0445* (2019.05); *G06F 3/0446* (2019.05); *G06F 3/04164* (2019.05); *G06F 2203/04111* (2013.01)
(58) Field of Classification Search
CPC . G06F 3/041–0412; G06F 2203/04111; G06F 3/0443; G06F 3/446; H01L 27/323; H01L 23/49827; H01L 21/486; H01L 23/49822; H01L 2924/12044; H05K 3/429; H05K 1/115; H05K 1/116; H05K 2201/09063; H05K 3/403; H05K 1/0222; H05K 1/114; H05K 2201/09645; H05K 3/4069
See application file for complete search history.

(56) References Cited

U.S. PATENT DOCUMENTS

| | | | |
|---|---|---|---|
| 2016/0378224 A1 | 12/2016 | Kwon et al. | |
| 2017/0271429 A1 | 9/2017 | Kim et al. | |
| 2018/0182817 A1 | 6/2018 | Jo et al. | |
| 2018/0188432 A1 | 7/2018 | Choi et al. | |
| 2018/0188866 A1* | 7/2018 | Heo | H01L 27/323 |
| 2018/0190723 A1 | 7/2018 | Han et al. | |
| 2018/0350883 A1 | 12/2018 | Lee et al. | |
| 2018/0350884 A1* | 12/2018 | Won | G06F 3/044 |
| 2019/0004638 A1* | 1/2019 | Lee | G06F 3/0443 |
| 2019/0339818 A1 | 11/2019 | Rhe et al. | |

FOREIGN PATENT DOCUMENTS

| | | |
|---|---|---|
| CN | 106293197 A | 1/2017 |
| CN | 103941930 B | 9/2017 |
| CN | 108258009 A | 7/2018 |

(Continued)

*Primary Examiner* — Sanjiv D. Patel
(74) *Attorney, Agent, or Firm* — Seed IP Law Group LLP (57) ABSTRACT

A touch display apparatus is provided. In the touch display apparatus, a touch structure may be disposed on an encapsulating element covering a light-emitting device. A touch insulating layer may be disposed between a touch electrode and a bridge electrode of the touch structure. The touch insulating layer may include a guide opening on a path of light emitted from the light-emitting device. A side of the guide opening may be covered by the touch electrode. Thus, in the touch display apparatus, the front luminance may be improved.

15 Claims, 5 Drawing Sheets

(56) References Cited

FOREIGN PATENT DOCUMENTS

| | | |
|---|---|---|
| JP | 2017-16655 A | 1/2017 |
| JP | 2018-109768 A | 7/2018 |
| JP | 2018-109963 A | 7/2018 |
| KR | 10-2017-0077942 A | 7/2017 |
| KR | 10-2018-0076688 A | 7/2018 |
| KR | 10-2018-0105767 A | 10/2018 |
| KR | 10-2019-0047532 A | 5/2019 |
| TW | 201712508 A | 4/2017 |
| TW | 201823949 A | 7/2018 |
| TW | 201828012 A | 8/2018 |

* cited by examiner

TOUCH DISPLAY APPARATUS HAVING A LIGHT-EMITTING DEVICE AND A TOUCH STRUCTURE

CROSS-REFERENCE TO RELATED APPLICATION(S)

This application claims the priority benefit of Korean Patent Application No. 10-2019-0176475, filed Dec. 27, 2019, which is hereby incorporated by reference as if fully set forth herein.

TECHNICAL FIELD

The present disclosure relates to a touch display apparatus in which a touch structure is disposed on an encapsulating element covering a light-emitting device.

DESCRIPTION OF THE RELATED ART

Generally, an electronic appliance, such as a monitor, a TV, a laptop computer and a digital camera, includes a display apparatus to realize an image. For example, the display apparatus may include at least one light-emitting device. The light-emitting device may emit light displaying a specific color. For example, the light-emitting device may include a light-emitting layer between a first emission electrode and a second emission electrode.

The display apparatus may run a specific program or input a specific signal by touch of a user or tool. For example, the display apparatus may include a touch structure. The touch structure may include touch electrodes and at least one bridge electrode electrically connecting adjacent electrodes. The touch structure may be disposed close to the light-emitting device. For example, the touch structure may be disposed on an encapsulating element covering the light-emitting device.

The touch electrodes and the bridge electrode of the touch structure may include a metal having a relatively low resistance. For example, the touch electrodes and the bridge electrode of the touch structure may be spaced apart from the light-emitting device. Light obliquely emitted from the light-emitting device with an inclination may be reflected inward by the touch electrodes and/or the bridge electrode. Thus, in the display apparatus, the light extraction efficiency may be decreased.

BRIEF SUMMARY

Accordingly, the present disclosure is directed to a touch display apparatus that substantially obviates one or more problems due to limitations and disadvantages of the related art.

One or more embodiments of the present disclosure provides a touch display apparatus capable of improving the light extraction efficiency.

One or more embodiments of the present disclosure provides a touch display apparatus capable of improving the front luminance of each pixel region.

Additional advantages, technical benefits, and features of the present disclosure will be set forth in part in the description which follows and in part will become apparent to those having ordinary skill in the art upon examination of the following or may be learned from practice of the present disclosure. The advantages of the present disclosure may be realized and attained by the structure particularly pointed out in the written description and claims hereof as well as the appended drawings.

To achieve these technical benefits, there is provided a touch display apparatus comprising a substrate. A light-emitting device and an encapsulating element are disposed on the substrate. The encapsulating element covers or partially covers the light-emitting device. A touch structure is disposed on the encapsulating element. The touch structure includes touch electrodes and at least one bridge electrode. The bridge electrode electrically connects adjacent touch electrodes. A touch insulating layer is disposed between the touch electrodes and the bridge electrode. The touch insulating layer includes a guide opening. The guide opening overlaps with the light-emitting device. A side of the guide opening is at least partially covered by one of the touch electrodes.

The side of the guide opening may be an inclined surface having an inclination angle with respect to an upper surface of the encapsulating element opposite to the substrate.

A region of the touch electrode which is disposed on the side of the guide opening may have a higher reflectance than a region of the corresponding touch electrode which is disposed on an upper surface of the touch insulating layer opposite to the substrate.

Each of the touch electrodes may have a structure in which a first touch electrode layer and a second touch electrode layer are stacked. The second touch electrode layer may have a smaller reflectance than the first touch electrode layer. The second touch electrode layer may be spaced apart from the guide opening of the touch insulating layer.

The touch insulating layer may include an organic insulating material.

An upper surface of the touch insulating layer opposite to the substrate may be a flat surface at the outside of the guide opening.

A touch pad may be disposed on the substrate. The touch pad may be spaced apart from the encapsulating element. The touch structure may be electrically connected to the touch pad by a touch routing line. The touch routing line may extend along a surface of the encapsulating element.

The touch pad may be disposed outside the touch insulating layer.

The bridge electrode may be disposed outside the light-emitting device.

In another embodiment, the touch display apparatus includes a substrate. A light-emitting device includes a first emission electrode, a light-emitting layer and a second emission electrode, which are sequentially stacked on the substrate. An encapsulating element is disposed on the second emission electrode. A touch insulating layer is disposed on the encapsulating element. The touch insulating layer includes a guide opening overlapping with the light-emitting device. A bridge electrode is disposed between the encapsulating element and the touch insulating layer. The bridge electrode is spaced apart from the guide opening of the touch insulating layer. A touch electrode is disposed on an upper surface of the touch insulating layer opposite to the substrate. The touch electrode is electrically connected to the bridge electrode. The touch electrode extends onto a side of the guide opening.

The touch electrode may be disposed outside the light-emitting device.

The touch electrode may have a multi-layer structure. A stacked structure of the touch electrode on the upper surface of the touch insulating layer may be different from a stacked structure of the touch electrode on the side of the guide opening.

The touch electrode may include includes a first touch electrode layer on the upper surface of the touch insulating layer, and a second touch electrode layer on the side of the guide opening. The first touch electrode layer may extend between the side of the guide opening and the second touch electrode layer. A reflectance of the second touch electrode layer may be higher than a reflectance of the first touch electrode layer.

The first touch electrode layer and the second touch electrode layer may include a metal.

A bank insulating layer may be disposed on the substrate. The bank insulating layer may at least partially cover an edge of the first emission electrode. A portion of the first emission electrode exposed by the bank insulating layer may have a smaller width than the guide opening of the touch insulating layer.

The bridge electrode may overlap with the bank insulating layer.

BRIEF DESCRIPTION OF THE SEVERAL VIEWS OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EMBODIMENT

Figure 1:
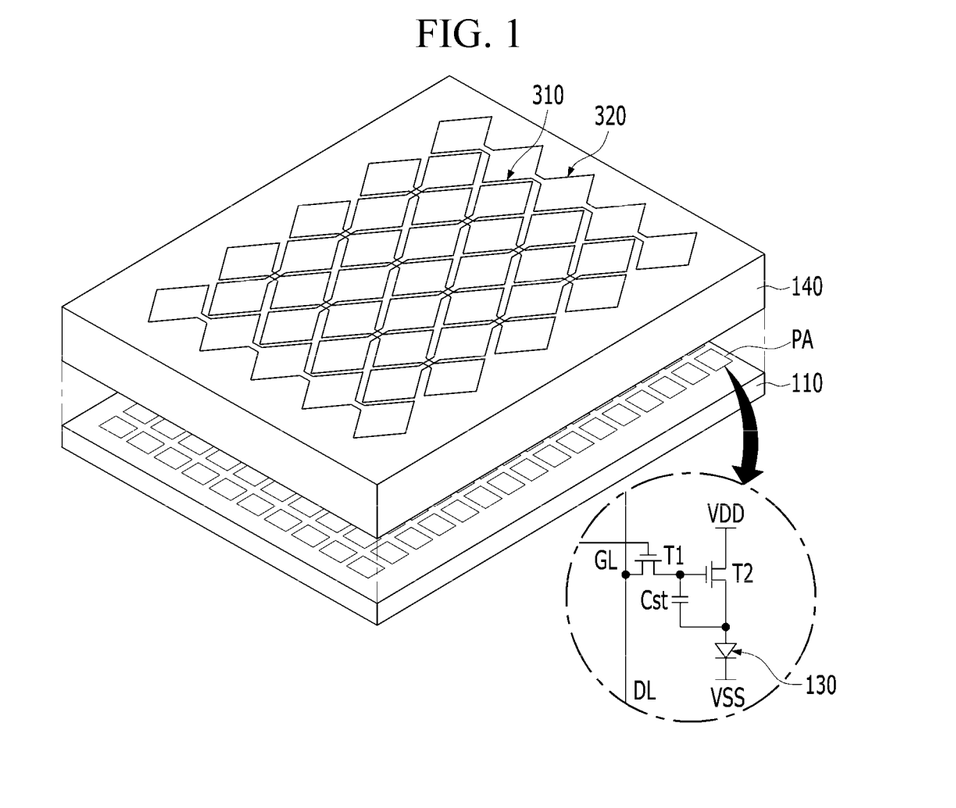
FIG. 1 is a view schematically showing a touch display apparatus according to an embodiment of the present disclosure.
Figure 2:
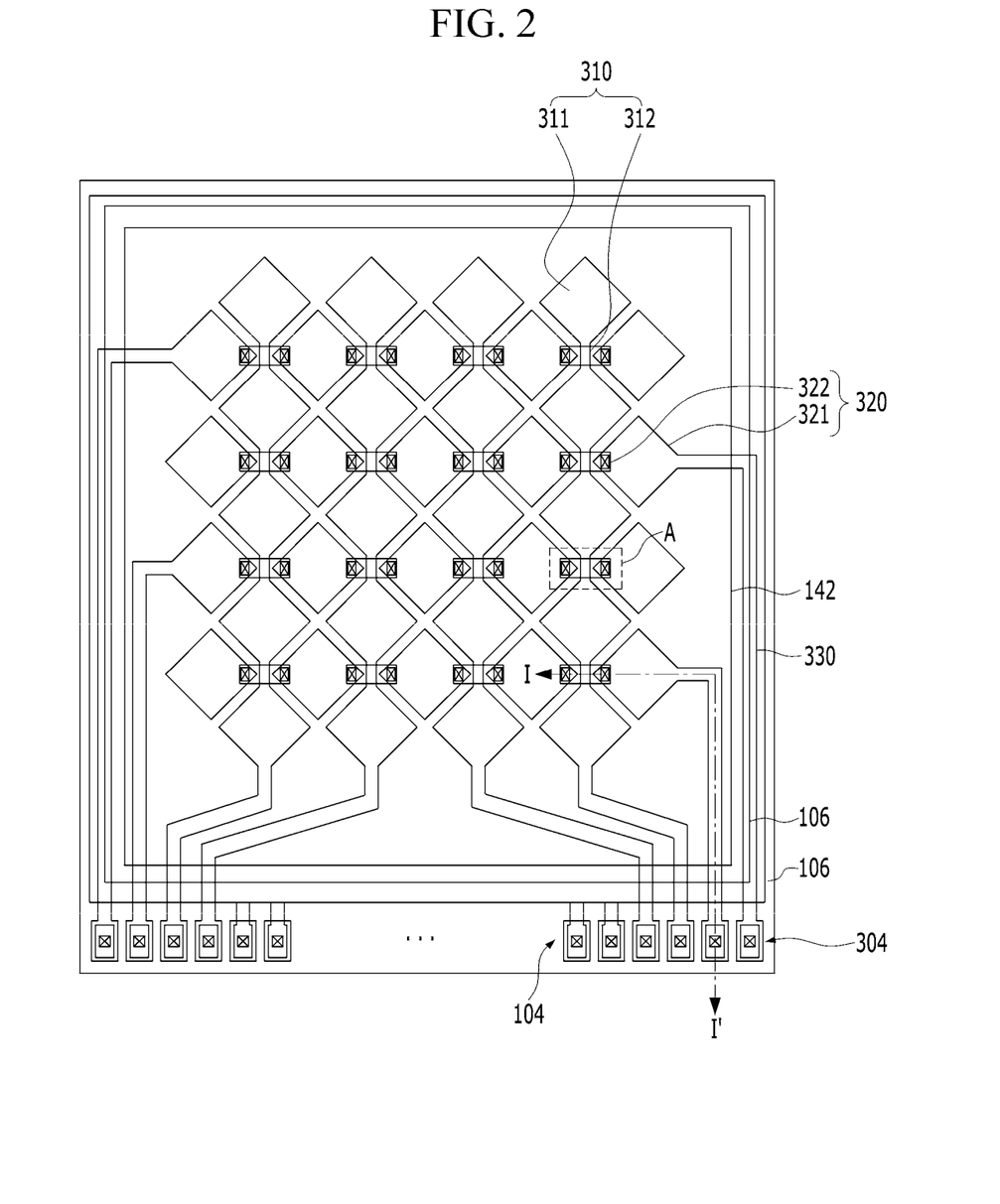
FIG. 2 is a view showing a top surface of the touch display apparatus according to the embodiment of the present disclosure.
Figure 3:
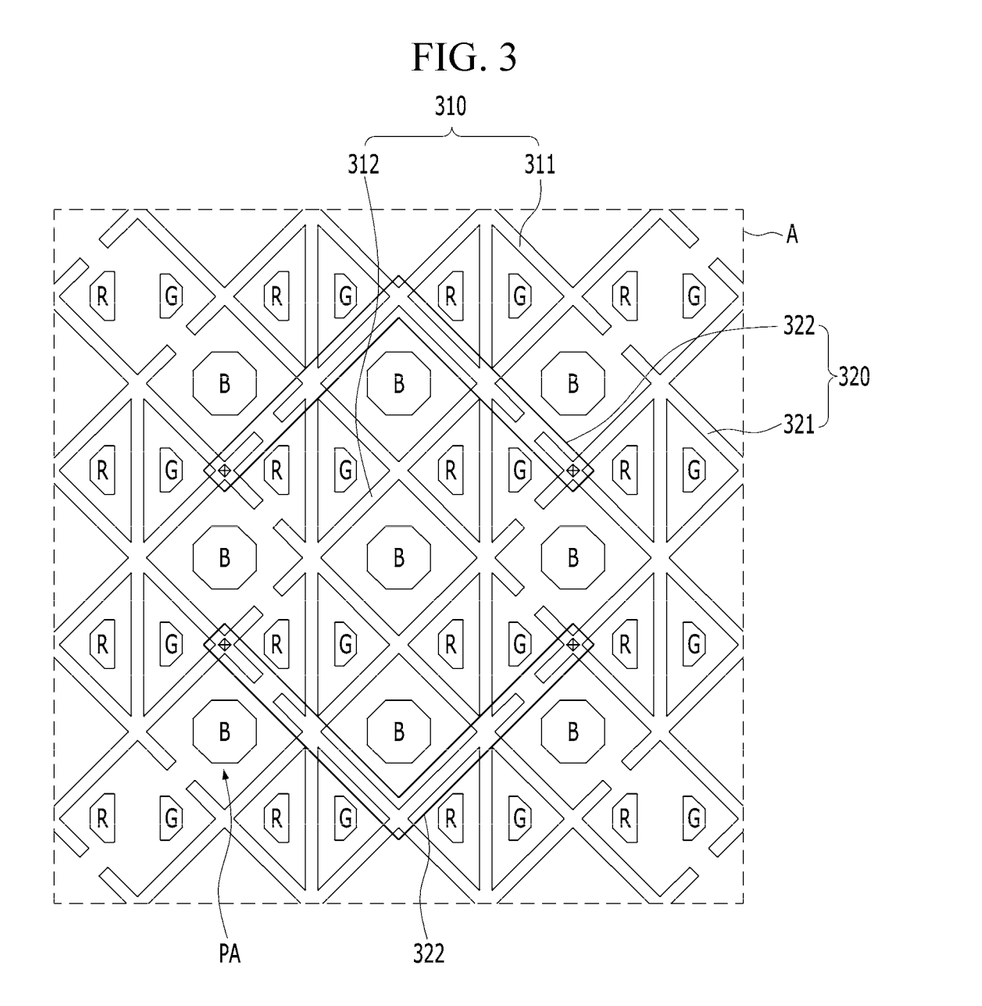
FIG. 3 is an enlarged view of A region in FIG. 2.
Figure 4:
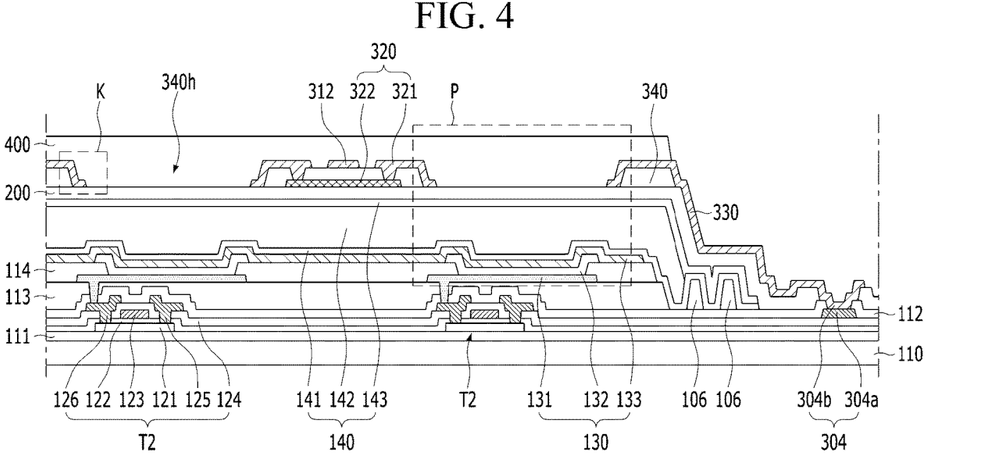
FIG. 4 is a view taken along I-I' of FIG. 2.
Figure 5:
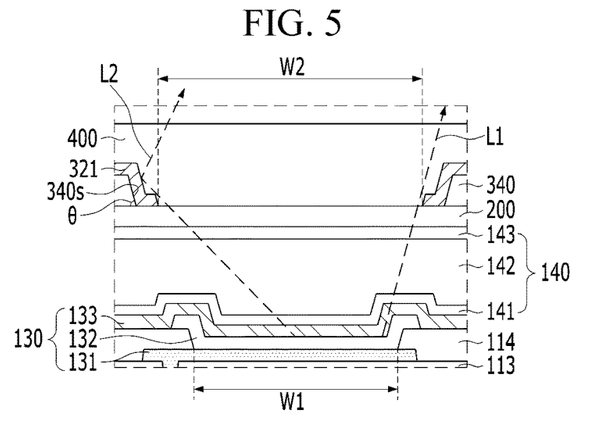
FIG. 5 is an enlarged view of P region in FIG. 4.

FIG. 1 is a view schematically showing a touch display apparatus according to an embodiment of the present disclosure. FIG. 2 is a view showing a top surface of the touch display apparatus according to the embodiment of the present disclosure. FIG. 3 is an enlarged view of A region in FIG. 2. FIG. 4 is a view taken along I-I' of FIG. 2. FIG. 5 is an enlarged view of P region in FIG. 4.

Referring to FIGS. 1 to 5, the touch display apparatus according to the embodiment of the present disclosure may include a substrate 110. The substrate 110 may include an insulating material. For example, the substrate 110 may include glass or plastic.

Signal lines GL, DL and VDD may be disposed on the substrate 110. For example, the signal lines GL, DL and VDD may include a gate line GL for transmitting a gate signal, a data line DL for transmitting a data signal, and a power supply line VDD for supplying a power voltage. The signal lines GL, DL and VDD may define pixel regions PA. Each of the pixel regions PA may emit light using signal applied through the signal lines GL, DL and VDD. For example, each of the pixel regions PA may include a driving circuit and a light-emitting device 130.

The driving circuit may generate a driving current corresponding to the data signal according to the gate signal. For example, the driving circuit may include a first thin film transistor T1, a second thin film transistor T2 and a storage capacitor Cst. The first thin film transistor T1 may turn on/off the second thin film transistor T2 according to the gate signal. The second thin film transistor T2 may generate the driving current corresponding to the data signal. The storage capacitor Cst may maintain the operation of the second thin film transistor T2 in one frame.

The first thin film transistor T1 and the second thin film transistor T2 may have the same or similar structure. For example, the second thin film transistor T2 may include a semiconductor pattern 121, a gate insulating layer 122, a gate electrode 123, an interlayer insulating layer 124, a source electrode 125 and a drain electrode 126.

The semiconductor pattern 121 may include a semiconductor material. For example, the semiconductor pattern 121 may include silicon. The semiconductor pattern 121 may be an oxide semiconductor. For example, the semiconductor pattern 121 may include a metal oxide, such as IGZO. The semiconductor pattern 121 may include a source region, a channel region and a drain region. The channel region may be disposed between the source region and the drain region. The source region and the drain region may have an electrical conductivity higher than the channel region.

The gate insulating layer 122 may be disposed on the semiconductor pattern 121. For example, the semiconductor pattern 121 may be disposed between the substrate 110 and the gate insulating layer 122. The gate insulating layer 122 may extend beyond the semiconductor pattern 121. For example, a side surface of the semiconductor pattern 121 may be in direct contact with the gate insulating layer 122. The gate insulating layer 122 may include an insulating material. For example, the gate insulating layer 122 may include silicon oxide (SiO) and/or silicon nitride (SiN). The gate insulating layer 122 may include a material having a high dielectric constant. For example, the gate insulating layer 122 may include a High-K material, such as hafnium oxide (HfO). The gate insulating layer 122 may have a multi-layer structure.

The gate electrode 123 may be disposed on the gate insulating layer 122. The gate electrode 123 may overlap with the channel region of the semiconductor pattern 121. For example, the source region and the drain region of the semiconductor pattern 121 may be disposed outside the gate electrode 123. The gate electrode 123 may include a conductive material. For example, the gate electrode 123 may include a metal, such as aluminum (Al), chromium (Cr), molybdenum (Mo), tungsten (W) and copper (Cu).

The interlayer insulating layer 124 may be disposed on the gate electrode 123. The interlayer insulating layer 124 may extend beyond the semiconductor pattern 121. For example, a side surface of the gate electrode 123 may be in direct contact with the interlayer insulating layer 124. The interlayer insulating layer 124 may include an insulating material. For example, the interlayer insulating layer 124 may include silicon oxide (SiO).

The source electrode 125 may be disposed on the interlayer insulating layer 124. The source electrode 125 may be electrically connected to the source region of the semiconductor pattern 121. For example, the gate insulating layer 122 and the interlayer insulating layer 124 may include a source contact hole partially exposing the source region of the semiconductor pattern 121. The source electrode 125 may be connected to the source region of the semiconductor pattern 121 via the source contact hole. For example, the source electrode 125 may include a portion overlapping with the source region of the semiconductor pattern 121. The source electrode 125 may include a conductive material. For example, the source electrode 125 may include a metal, such as aluminum (Al), chromium (Cr), copper (Cu), titanium (Ti), molybdenum (Mo) and tungsten (W). The source electrode 125 may include a material different from the gate electrode 123.

The drain electrode 126 may be disposed on the interlayer insulating layer 124. The drain electrode 126 may be electrically connected to the drain region of the semiconductor pattern 121. The drain electrode 126 may be spaced apart from the source electrode 125. For example, the gate insulating layer 122 and the interlayer insulating layer 124 may include a drain contact hole partially exposing the drain region of the semiconductor pattern 121. The drain electrode 126 may be connected to the drain region of the semiconductor pattern 121 via the drain contact hole. For example, the drain electrode 126 may include a portion overlapping with the drain region of the semiconductor pattern 121. The drain electrode 126 may include a conductive material. For example, the drain electrode 126 may include a metal, such as aluminum (Al), chromium (Cr), copper (Cu), titanium (Ti), molybdenum (Mo) and tungsten (W). The drain electrode 126 may include the same material as the source electrode 125. For example, the drain electrode 126 may include a material different from the gate electrode 123.

The gate electrode of the first thin film transistor T1 may be electrically connected to the gate line GL. The gate electrode 123 of the second thin film transistor T2 may be electrically connected to the drain electrode of the first thin film transistor T1. The source electrode of the first thin film transistor T1 may be connected to the data line DL. The source electrode 125 of the second thin film transistor T2 may be connected to the power supply line VDD. The storage capacitor Cst may include a first capacitor electrode connected to the drain electrode of the first thin film transistor T1, and a second capacitor electrode connected to the drain electrode 126 of the second thin film transistor T2.

A device buffer layer 111 may be disposed between the substrate 110 and the driving circuits. For example, the first thin film transistor T1, the second thin film transistor T2 and the storage capacitor Cst of each driving circuit may be disposed on the device buffer layer 111. The device buffer layer 111 may prevent pollution from the substrate 110 during the process of forming the driving circuits. The device buffer layer 111 may include an insulating material. For example, the device buffer layer 111 may include silicon oxide (SiO) and/or silicon nitride (SiN). The device buffer layer 111 may have a multi-layer structure. For example, the device buffer layer 111 may have a structure in which an insulating layer formed of silicon oxide (SiO) and an insulating layer formed of silicon nitride (SiN) are stacked.

A lower passivation layer 112 may be disposed on the driving circuits. The lower passivation layer 112 may prevent the damage of the driving circuits due to external moisture and the impact. The lower passivation layer 112 may extend along a surface of each driving circuit opposite to the substrate 110. The lower passivation layer 112 may extend beyond each driving circuit. For example, the lower passivation layer 112 may at least partially cover the source electrode 125 and the drain electrode 126 of each second thin film transistor T2. The lower passivation layer 112 may include an insulating material. The lower passivation layer 112 may include an inorganic insulating material. For example, the lower passivation layer 112 may include silicon oxide (SiO) or silicon nitride (SiN).

An over-coat layer 113 may be disposed on the lower passivation layer 112. The over-coat layer 113 may remove a thickness difference due to the driving circuits. For example, the thickness difference due to each second thin film transistor T2 may be removed by the over-coat layer 113. A surface of the over-coat layer 113 opposite to the substrate 110 may be a flat surface. The over-coat layer 113 may include an insulating material. The over-coat layer 113 may include a material having relatively high fluidity. For example, the over-coat layer 113 may include an organic insulating material.

The light-emitting device 130 may be disposed on the over-coat layer 113. The light-emitting device 130 may emit light displaying a specific color. For example, the light-emitting device 130 may include a first emission electrode 131, a light-emitting layer 132 and a second emission electrode 133, which are sequentially stacked on the over-coat layer 113.

The first emission electrode 131 may include a conductive material. The first emission electrode 131 may include a material having a relatively high reflectance. For example, the first emission electrode 131 may include a metal, such as aluminum (Al) and silver (Ag). The first emission electrode 131 may have a multi-layer structure. For example, the first emission electrode 131 may have a structure in which a reflective electrode formed of a metal is disposed between transparent electrodes formed of a transparent conductive material, such as ITO and IZO.

The light-emitting layer 132 may generate light having luminance corresponding to a voltage difference between the first emission electrode 131 and the second emission electrode 133. For example, the light-emitting layer 132 may be an emission material layer (EML) including an emission material. The emission material may include an organic material, an inorganic material or a hybrid material. For example, the touch display apparatus according to the embodiment of the present disclosure may be an organic light-emitting display apparatus having the light-emitting layer 132 of an organic material.

The second emission electrode 133 may include a conductive material. The second emission electrode 133 may include a material different from the first emission electrode 131. For example, the second emission electrode 133 may be a transparent electrode formed of a transparent conductive material, such as ITO and IZO. Thus, in the touch display apparatus according to the embodiment of the present disclosure, the light generated by the light-emitting layer 132 may be emitted through the second emission electrode 133.

The light-emitting device 130 may further include an emitting function layer between the first emission electrode 131 and the light-emitting layer 132, and/or between the light-emitting layer 132 and the second emission electrode 133. The emitting function layer may include at least one of a hole injection layer (HIL), a hole transporting layer (HTL), an electron transporting layer (ETL), and an electrode injection layer (EIL). Thus, in the touch display apparatus according to the embodiment of the present disclosure, the emission efficiency of the light-emitting device 130 may be improved.

The light-emitting device 130 of each pixel region PA may be electrically connected to the driving circuit of the corresponding pixel region PA. For example, the lower passivation layer 112 and the over-coat layer 113 may include electrode contact holes partially exposing the second thin film transistor T2 of each driving circuit. The first emission electrode 131 of each pixel region PA may be electrically connected to the second thin film transistor T2 of the corresponding pixel region PA via the corresponding electrode contact hole. For example, the first emission electrode 131 of each light-emitting device 130 may be electrically connected to the drain electrode 126 of the corresponding second thin film transistor T2.

The light-emitting device 130 of each pixel region PA may be independently controlled from the light-emitting device 130 of adjacent pixel region PA. For example, the first emission electrode 131 of each pixel region PA may be insulated from the first emission electrode 131 of adjacent pixel region PA. The first emission electrode 131 of each pixel region PA may be spaced apart from the first emission electrode 131 of adjacent pixel region PA. A bank insulating layer 114 may be disposed in a space between adjacent first emission electrodes 131. The bank insulating layer 114 may include an insulating material. For example, the bank insulating layer 114 may include an organic insulating material. The bank insulating layer 114 may be disposed on the over-coat layer 113. For example, the bank insulating layer 114 may be in direct contact with the over-coat layer 113 between adjacent first emission electrodes 131. The bank insulating layer 114 may include a material different from the over-coat layer 113. The bank insulating layer 114 may at least partially cover an edge of each first emission electrode 131. For example, the light-emitting layer 132 and the second emission electrode 133 of each pixel region PA may be stacked on a portion of the corresponding first emission electrode 131 which is exposed by the bank insulating layer 114.

Each of the pixel regions PA may realize a color different from adjacent pixel region PA. For example, the light-emitting layer 132 of each pixel region PA may include a material different from the light-emitting layer 132 of adjacent pixel region PA. The light-emitting layer 132 of each pixel region PA may be spaced apart from the light-emitting layer 132 of adjacent pixel region PA. For example, the light-emitting layer 132 of each pixel region PA may include an end on the bank insulating layer 114. The light-emitting layer 132 of each pixel region PA may be formed by a different process from the light-emitting layer 132 of adjacent pixel region PA. For example, the light-emitting layer 132 of each pixel region PA may be formed by a deposition process using fine metal mask (FMM).

The second emission electrode 133 of each pixel region PA may be applied with the same voltage as the second emission electrode 133 of adjacent pixel region PA. For example, the second emission electrode 133 of each pixel region PA may be electrically connected to the second emission electrode 133 of adjacent pixel region PA. The second emission electrode 133 of each pixel region PA may include the same material as the second emission electrode 133 of adjacent pixel region PA. The second emission electrode 133 of each pixel region PA may be in contact with the second emission electrode 133 of adjacent pixel region PA. For example, the second emission electrode 133 of each pixel region PA may extend onto the bank insulating layer 114.

The light-emitting device 130 of each pixel region PA may have the same structure as the light-emitting device 130 of adjacent pixel region PA. For example, the light-emitting device 130 of each pixel region PA may include the emitting function layer same as the light-emitting device 130 of adjacent pixel region PA. The emitting function layer of each pixel region PA may be connected to the emitting function layer of adjacent pixel region PA. For example, in the touch display apparatus according to the embodiment of the present disclosure, at least one of the hole injection layer (HIL), the hole transporting layer (HTL), the electron transporting layer (ETL), and the electrode injection layer (EIL) may extend onto the bank insulating layer 114.

An encapsulating element 140 may be disposed on the light-emitting device 130 of each pixel region PA. The encapsulating element 140 may prevent the damage of the light-emitting devices 130 due to the external moisture and impact. The encapsulating element 140 may extend beyond the second emission electrode 133. For example, the encapsulating element 140 may at least partially cover the over-coat layer 113, the bank insulating layer 114 and the light-emitting devices 130.

The encapsulating element 140 may have a multi-layer structure. For example, the encapsulating element 140 may include a first encapsulating layer 141, a second encapsulating layer 142 and a third encapsulating layer 143, which are sequentially stacked on the second emission electrode 133. The first encapsulating layer 141, the second encapsulating layer 142 and the third encapsulating layer 143 may include an insulating material. The second encapsulating layer 142 may include a material different from the first encapsulating layer 141 and the third encapsulating layer 143. For example, the first encapsulating layer 141 and the third encapsulating layer 143 may include an inorganic insulating material, and the second encapsulating layer 142 may include an organic insulating material. Thus, in the touch display apparatus according to the embodiment of the present disclosure, the damage of the light-emitting devices 130 due to the external moisture and impact may be effectively prevented. The thickness difference due to the light-emitting devices 130 may be removed by the second encapsulating layer 142. For example, an upper surface of the encapsulating element 140 opposite to the substrate 110 may be parallel with a surface of the substrate 110.

Touch structures 310 and 320 may be disposed on the encapsulating element 140. The touch structures 310 and 320 may detect the touch of a user or tool. For example, each of the touch structures 310 and 320 may include touch electrodes 311 and 321, and at least one bridge electrode 312 and 322. Each of the bridge electrodes 312 and 322 may electrically connect adjacent touch electrodes 311 and 321. A touch buffer layer 200 may be disposed between the encapsulating element 140 and the touch structures 310 and 320. The touch buffer layer 200 may prevent the damage of the light-emitting devices 130 and the encapsulating element 140 due to a process of forming the touch structures 310 and 320. The touch buffer layer 200 may include an insulating material. For example, the touch buffer layer 200 may include silicon nitride (SiN) and/or silicon oxide (SiO).

The touch electrodes 311 and 321 may include a conductive material. The touch electrodes 311 and 321 may include a material having a relatively low resistance. The touch electrodes 311 and 321 may have a material having a relatively high reflectance. For example, the touch electrodes 311 and 321 may include a metal, such as aluminum (Al).

The bridge electrodes 312 and 322 may include a conductive material. The bridge electrodes 312 and 322 may include a material having a relatively low resistance. For example, the bridge electrodes 312 and 322 may include a metal, such as aluminum (Al), chromium (Cr), molybdenum (Mo), tungsten (W) and copper (Cu).

The touch electrodes 311 and 321 and the bridge electrodes 312 and 322 may be disposed outside the light-emitting devices 130. The touch electrodes 311 and 321 and the bridge electrodes 312 and 322 may be spaced apart from the light-emitting devices 130. For example, the touch electrodes 311 and 321 and the bridge electrodes 312 and 322 may overlap with the bank insulating layer 114. Each of the touch electrodes 311 and 321 may be a mesh shape which has an aperture overlapping with the light-emitting devices 130. Thus, in the touch display apparatus according to the embodiment of the present disclosure, the light emitted from the light-emitting devices 130 in a direction perpendicular to the surface of the substrate 110 may be not blocked by the touch electrodes 311 and 321 and the bridge electrodes 312 and 322. And, in the touch display apparatus according to the embodiment of the present disclosure, the light emitted from the light-emitting device 130 of each pixel region PA in a direction toward adjacent pixel region PA may be blocked by the touch electrodes 311 and 321 and the bridge electrodes 312 and 322. Therefore, in the touch display apparatus according to the embodiment of the present disclosure, the quality deterioration of an image due to mixing of the light emitted from adjacent pixel regions PA may be prevented.

The touch structures 310 and 320 may be composed of first touch structures 310 and second touch structures 320. Each of the first touch structures 310 may include first touch electrodes 311 and at least one first bridge electrode 312. The first touch electrodes 311 may be connected in a first direction by the first bridge electrode 321. Each of the second touch structures 320 may include second touch electrodes 321 and at least one second bridge electrode 322. The second touch electrodes 321 may be connected in a second direction perpendicular to the first direction by the second bridge electrode 322. The second touch electrodes 321 may be disposed side by side with the first touch electrodes 311. For example, the second touch electrodes 321 may be disposed on the same layer as the first touch electrodes 311. The second bridge electrode 322 may intersect the first bridge electrode 312. The second bridge electrode 322 may be insulated from the first bridge electrode 312. For example, the second bridge electrode 322 may be disposed on a layer different from the first bridge electrode 312.

A touch insulating layer 340 may be disposed between the first bridge electrode 312 and the second bridge electrode 322. The second bridge electrode 322 may be disposed between the touch buffer layer 200 and the touch insulating layer 340. The first touch electrodes 311 and the second touch electrodes 321 may be disposed on the touch insulating layer 340. For example, the first bridge electrode 312 may include the same material as the first touch electrodes 311 and the second touch electrodes 321. The first bridge electrode 312 may be in direct contact with the first touch electrodes 311. The second bridge electrode 322 may include a material different from the first bridge electrode 312. The touch insulating layer 340 may include touch contact holes exposing a portion of the second bridge electrode 322. The second touch electrodes 321 may be connected to the second bridge electrode 322 via the touch contact holes.

The touch insulating layer 340 may include an insulating material. The touch insulating layer 340 may remove a thickness difference due to the second bridge electrode 322. For example, an upper surface of the touch insulating layer 340 opposite to the substrate 110 may be a flat surface. The touch insulating layer 340 may include an organic insulating material.

The touch insulating layer 340 may include a plurality of guide opening 340h overlapping with the light-emitting devices 130. A side 340s of each guide opening 340h may be at least partially covered by one of the touch electrodes 311 and 321. Thus, in the touch display apparatus according to the embodiment of the present disclosure, the light L2 emitted from the light-emitting device 130 of each pixel region PA in the direction of the side 340s of the corresponding guide opening 340h may be reflected in the inner direction of the corresponding pixel region PA. Therefore, in the touch display apparatus according to the embodiment of the present disclosure, the light extraction efficiency may be improved.

As shown in FIG. 5, the side 340s of each guide opening 340h may be an inclined surface having an inclination angle θ with respect to the upper surface of the encapsulating element 140. For example, a width W2 of each guide opening 340h may increase as the distance from the encapsulating element 140 increases. That is, in the touch display apparatus according to the embodiment of the present disclosure, interference due to the light reflected by the side 340s of each guide opening 340h may be prevented. Thus, in the touch display apparatus according to the embodiment of the present disclosure, the front luminance of each pixel region PA may be effectively improved by the light reflected by the side 340s of each guide opening 340h.

The width W2 of each guide opening 340h may be larger than a width W1 of a portion of the corresponding first emission electrode 131 exposed by the bank insulating layer 114. For example, the light L1 emitted from each light-emitting device 130 at a certain inclination angle or less may pass through the corresponding guide opening 340h. Thus, in the touch display apparatus according to the embodiment of the present disclosure, an emission angle of the light L1 emitted from each light-emitting device 130 may be determined by the touch structures 310 and 320. Therefore, in the touch display apparatus according to the embodiment of the present disclosure, a viewing angle may be controlled by the guide openings 340h of the touch insulating layer 340.

In some embodiments, additional elements such as a touch buffer layer 200 may be included between the touch insulating layer 340 and the encapsulating element 140. In these examples, the side 340s of each guide opening 340h may have an inclination angle θ that is formed as an angle between the side 340s of the guide opening 340h and an upper surface (e.g., top surface) of the touch buffer layer 200. In other embodiments, a width W2 of each guide opening 340h may be differently defined based on additional elements further covering (or partially covering) the side 340s of the guide opening 340h. For example, if a touch electrode 321 is on the side 340s of the guide opening 340h, the width W2 of each guide opening 340h may be defined as the opening defined between the ends of the touch electrode 321 (e.g., a first end of a touch electrode and a second end of an adjacent touch electrode that is opposite of the first end).

A touch cover layer 400 may be disposed on the touch structures 310 and 320. The touch cover layer 400 may prevent the damage of the touch structures 310 and 320 due to the external impact. The touch cover layer 400 may include an insulating material.

Pads 104 and 304 may be disposed on the substrate 110. The pads 104 and 304 may be spaced apart from the encapsulating element 140. For example, the pads 104 and 304 may be disposed outside the encapsulating element 140. At least one dam 106 may be disposed between the encapsulating element 140 and the pads 104 and 304. The dam 106 may block the flow of the second encapsulating layer 142 having relatively high fluidity. For example, the dam 106 may define a region at least partially covered by the second encapsulating layer 142. The dam 106 may extend along an edge of the substrate 110. The dam 106 may include an insulating material. The dam 106 may include the same material as one of insulating layers formed between the substrate 110 and the light-emitting device 130. For example, the dam 106 may be simultaneously formed with the over-coat layer 113.

The pads 104 and 304 may be composed of display pads 104 and touch pads 304. Each of the display pads 104 may be electrically connected to one of the signal lines GL, DL and VDD. The display pads 104 may include a conductive material. The display pads 104 may include the same material as one of electrodes composed of the driving circuits. For example, the display pads 104 may be simultaneously formed with the source electrode 125 and the drain electrode 126 of each second thin film transistor T2.

Each of the touch pads 304 may be electrically connected to one of the touch structures 310 and 320. For example, each of the touch structures 310 and 302 may be electrically connected to the corresponding touch pad 304 by one of touch routing lines 330 which extend along a surface of the encapsulating element 140. Each of the touch routing lines 330 may include the same material as the touch electrodes 311 and 321 of the corresponding touch structure 310 and 320. For example, the touch routing lines 330 may be simultaneously formed with the touch electrodes 311 and 321 of the corresponding touch structure 310 and 320. Each of the touch routing lines 330 may be in direct contact with the touch electrodes 311 and 321 of the corresponding touch structure 310 and 320.

Each of the touch pads 304 may have a multi-layer structure. For example, each of the touch pads 304 may include a lower pad layer 304a disposed on the same layer as the display pads 104, and an upper pad layer 304b disposed on the same layer as the touch routing lines 330. The lower pad layer 304a may include the same material as the display pad 104. The upper pad layer 304b may include the same material as the touch routing lines 330. For example, the upper pad layer 304b of each touch pads 304 may be directly connected to the corresponding touch routing line 330. The lower passivation layer 112 and the touch buffer layer 200 may extend onto the outside of the dam 106. For example, the lower passivation layer 112 and the touch buffer layer 200 may include pad contact holes partially exposing the lower pad layer 304a of each touch pad 304. The upper pad layer 304b of each touch pad 304 may be in direct contact with the lower pad layer 304a of the corresponding touch pad 304 in the corresponding pad contact hole.

The display pads 104 and the touch pads 304 may be disposed outside the touch insulating layer 340. The touch insulating layer 340 may be spaced apart from the display pads 104 and the touch pads 304. For example, the touch insulating layer 340 may be disposed only in a region defined by the dam 106. Thus, in the touch display apparatus according to the embodiment of the present disclosure, a thickness difference due to the touch insulating layer 340 may not be formed between the lower pad layer 304a and the upper pad layer 304b of each touch pad 304. That is, in the touch display apparatus according to the embodiment of the present disclosure, a depth of the pad contact holes partially exposing the lower pad layer 304a of each touch pad 304 may be independent of the thickness of the touch insulating layer 340. Therefore, in the touch display apparatus according to the embodiment of the present disclosure, the lower pad layer 304a and the upper pad layer 304b of each touch pad 304 may be stably connected.

Accordingly, the touch display apparatus according to the embodiment of the present disclosure may include the first touch structures 310 and the second touch structures 320 on the encapsulating element 140 which at least partially covers the light-emitting devices 130, wherein the touch insulating layer 340 insulating the first bridge electrode 312 of each first touch structure 310 from the second bridge electrode 322 of each second touch structure 320 may include the guide openings 340h overlapping with the light-emitting devices 130, and wherein the side 340s of each guide opening 340h may be at least partially covered by one of the touch electrodes 311 and 321 of the touch structures 310 and 320. Thus, in the touch display apparatus according to the embodiment of the present disclosure, the light extraction efficiency and the front luminance of each pixel region PA may be improved. Thereby, in the touch display apparatus according to the embodiment of the present disclosure, the quality of the image may be improved.

Figure 6:
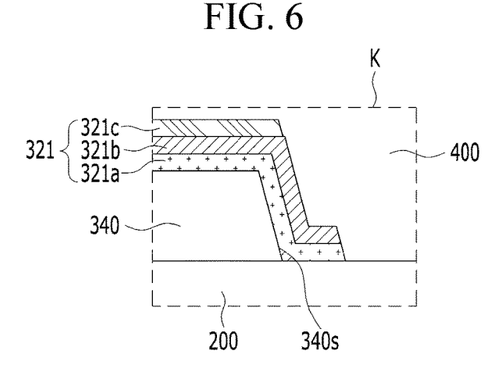
FIGS. 6 to 8 are views respectively showing the touch display apparatus according to another embodiment of the present disclosure.

FIG. 6 is an enlarged view of K region in FIG. 4. Referring to FIGS. 4 to 6, the touch display apparatus according to another embodiment of the present disclosure may comprise the touch electrodes 311 and 312 which have a multi-layer structure. For example, each of the touch electrodes 311 and 321 may include a first touch electrode layer 321a, a second touch electrode layer 321b and a third touch electrode layer 321c, which are sequentially stacked on the touch insulating layer 340. The first touch electrode layer 321a, the second touch electrode layer 321b and the third touch electrode layer 321c may include a conductive material. The first touch electrode layer 321a, the second touch electrode layer 321b and the third touch electrode layer 321c may include a material different from each other. For example, the first touch electrode layer 321a and the third touch electrode layer 321c may include titanium (Ti), and the second touch electrode layer 321b may include aluminum (Al).

A stacked structure of the touch electrodes 311 and 321 on an upper surface of the touch insulating layer 340 opposite to the substrate 110 may be different from a stacked structure of the touch electrodes 311 and 321 on the side 340s of each guide opening 340h. For example, in the touch display apparatus according to the embodiment of the present disclosure, the third touch electrode layer 321c may not be formed on the side 340s of each guide opening 340h. The third touch electrode layer 321c may have a lower reflectance than the second touch electrode layer 321b. Thus, in the touch display apparatus according to another embodiment of the present disclosure, a region of the touch electrodes 311 and 321 disposed on the side 340s of each guide opening 340h may have a higher reflectance than a region of the corresponding touch electrode 311 and 321 disposed on the upper surface of the touch insulating layer 340 opposite to the substrate 110. Therefore, in the touch display apparatus according to another embodiment of the present disclosure, the reflection of the external light due to the touch electrodes 311 and 321 may be prevented, and the light extraction efficiency and the front luminance of each pixel region PA may be improved using the side 340s of each guide opening 340h.

Figure 7:
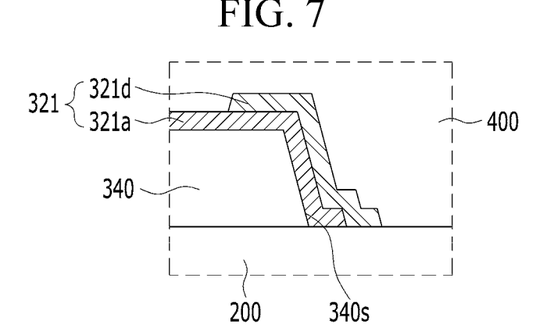

The touch display apparatus according to another embodiment of the present disclosure is described that the touch electrodes 311 and 321 may have a relatively small number of stacks on the side 340s of each guide opening 340h. However, in the touch display apparatus according to still another embodiment of the present disclosure, each of the touch electrodes 311 and 321 may have a structure in which more layers are stacked than the upper surface of the touch insulating layer 340 opposite to the substrate 110 on the side 340s of each guide opening 340h. For example, in the touch display apparatus according to another embodiment of the present disclosure, each of the touch electrodes 311 and 321 may include a low-resistance metal layer 321a and a reflective electrode layer 321d, as shown in FIG. 7. The low-resistance metal layer 321a may extend along a surface of the touch insulating layer 340. The reflective electrode layer 321d may overlap with the side 340s of each guide opening 340h. The low-resistance metal layer 321a may extend between the side 340s of each guide opening 340h and the reflective electrode layer 321d. The reflective electrode layer 321d may include an end which is disposed on the upper surface of the touch insulating layer 340 opposite to the substrate 110. For example, the reflective electrode layer 321d of each touch electrode 311 and 321 may be disposed outside the bridge electrodes 312 and 322.

The low-resistance metal layer 321a may include a material having a relatively low resistance. For example, the low-resistance metal layer 321a may include a metal, such as chromium (Cr), copper (Cu), titanium (Ti), molybdenum (Mo) and tungsten (W). The reflective electrode layer 321d may include a material having a relatively high reflectance. For example, the reflective electrode layer 321d may include a metal, such as aluminum (Al) and silver (Ag). The reflectance of the reflective electrode layer 321d may be higher than the reflectance of the low-resistance metal layer 321a. Thus, in the touch display apparatus according to another embodiment of the present disclosure, the degree of freedom for a process of forming the touch electrodes 311 and 321 having different reflectance according to regions may be improved. And, in the touch display apparatus according to another embodiment of the present disclosure, the reflection of the external light due to the touch electrodes 311 and 321 may be reduced or minimized, and the reflection due to the touch electrodes 311 and 321 on the side 340s of each guide opening 340h may be increased or maximized.

Figure 8:
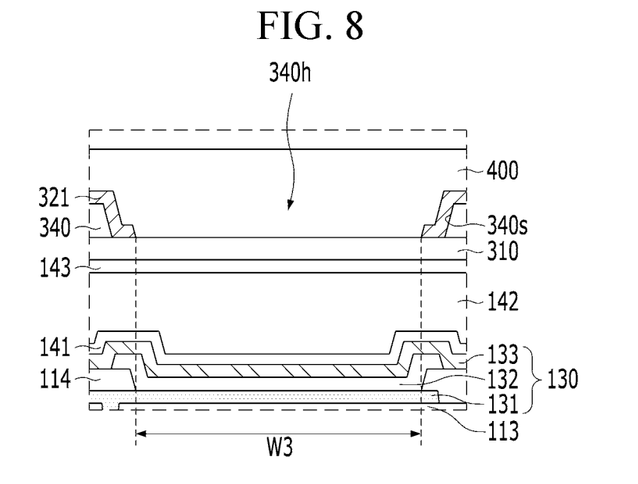

The touch display apparatus according to the embodiment of the present disclosure is described that an end of each touch electrode 311 and 321 may overlap with the bank insulating layer 114. However, in the touch display apparatus according to another embodiment of the present disclosure, a distance between the touch electrodes 321 in each guide opening 340h may be the same or substantially the same as a width W3 of the portion of each first emission electrode 131 exposed by the bank insulating layer 114, as shown in FIG. 8. Thus, in the touch display apparatus according to another embodiment of the present disclosure, the viewing angle may be controlled by the touch electrodes 321. For example, the touch display apparatus according to another embodiment of the present disclosure may realize a narrow viewing angle using the touch electrodes 321. Therefore, in the touch display apparatus according to another embodiment of the present disclosure, the quality of the image provided to the user may be improved.

In the result, the touch display apparatus according to the embodiments of the present disclosure may include the touch structures on the encapsulating element at least partially covering the light-emitting devices, and a touch insulating layer between the touch electrodes and the bridge electrodes of the touch structures, wherein the touch insulating layer may include the guide openings overlapping with the light-emitting devices, and wherein the side of each guide opening may be at least partially covered by one of the touch electrodes. Thus, in the touch display apparatus according to the embodiments of the present disclosure, the light emitted obliquely from the light-emitting devices may be reflected to the outside by a region of the touch electrodes which is disposed on the side of each guide opening. Thereby, in the touch display apparatus according to the embodiments of the present disclosure, the light extraction efficiency and the front luminance of each pixel region may be improved.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A touch display apparatus, comprising:
    a light-emitting device on a substrate;
    an encapsulating element on the substrate, the encapsulating element at least partially covering the light-emitting device;
    a touch structure on the encapsulating element, the touch structure including touch electrodes and at least one bridge electrode electrically connecting adjacent touch electrodes;
    a touch insulating layer between the touch electrodes and the bridge electrode; and
    a guide opening in the touch insulating layer, wherein the guide opening overlaps the light-emitting device,
    wherein a side of the guide opening is at least partially covered by one of the touch electrodes, and
    wherein the side of the guide opening is an inclined surface having an inclination angle with respect to an upper surface of the encapsulating element opposite to the substrate.

2. The touch display apparatus according to claim 1, wherein a region of the touch electrode which is disposed on the side of the guide opening has a higher reflectance than a region of the corresponding touch electrode which is disposed on an upper surface of the touch insulating layer opposite to the substrate.

3. The touch display apparatus according to claim 2, wherein each of the touch electrodes has a structure in which a first touch electrode layer and a second touch electrode layer are stacked, wherein
    the second touch electrode layer has a lower reflectance than the first touch electrode layer, and
    the second touch electrode layer is spaced apart from the guide opening of the touch insulating layer.

4. The touch display apparatus according to claim 1, wherein the touch insulating layer includes an organic insulating material.

5. The touch display apparatus according to claim 4, wherein an upper surface of the touch insulating layer opposite to the substrate is a substantially flat surface at an outside of the guide opening.

6. The touch display apparatus according to claim 4, further comprising:
    a touch pad on the substrate, the touch pad spaced apart from the encapsulating element; and
    a touch routing line extending along a surface of the encapsulating element,
    wherein the touch structure is electrically connected to the touch pad by the touch routing line,
    wherein the touch pad is disposed outside of the touch insulating layer.

7. The touch display apparatus according to claim 1, wherein the bridge electrode is disposed outside of the light-emitting device.

8. A touch display apparatus, comprising:
    a light-emitting device including a first emission electrode, a light-emitting layer, and a second emission electrode, which are sequentially stacked on a substrate;
    an encapsulating element on the second emission electrode of the light-emitting device;
    a touch insulating layer on the encapsulating element;
    a guide opening in the touch insulating layer, the guide opening overlapping with the light-emitting device;
    a bridge electrode between the encapsulating element and the touch insulating layer, the bridge electrode spaced apart from the guide opening of the touch insulating layer; and
    a touch electrode on an upper surface of the touch insulating layer opposite to the substrate, the touch electrode electrically connected to the bridge electrode,
    wherein the touch electrode extends onto a side of the guide opening, and
    wherein the side of the guide opening is an inclined surface having an inclination angle with respect to an upper surface of the encapsulating element opposite to the substrate.

9. The touch display apparatus according to claim 8, wherein the touch electrode is disposed outside of the light-emitting device.

10. The touch display apparatus according to claim 8, wherein the touch electrode has a multi-layer structure, and
    wherein a stacked structure of the touch electrode on the upper surface of the touch insulating layer is different from a stacked structure of the touch electrode on the side of the guide opening.

11. The touch display apparatus according to claim 10, wherein the touch electrode includes a first touch electrode layer on the upper surface of the touch insulating layer, and a second touch electrode layer on the side of the guide opening, wherein
    the first touch electrode layer extends between the side of the guide opening and the second touch electrode layer, and
    a reflectance of the second touch electrode layer is higher than a reflectance of the first touch electrode layer.

12. The touch display apparatus according to claim 11, wherein the first touch electrode layer and the second touch electrode layer includes a metal.

13. The touch display apparatus according to claim 8, further comprising a bank insulating layer on the substrate, the bank insulating layer at least partially covering an edge of the first emission electrode,
    wherein a portion of the first emission electrode exposed by the bank insulating layer has a smaller width than the guide opening of the touch insulating layer.

14. The touch display apparatus according to claim 13, wherein the bridge electrode overlaps with the bank insulating layer.

15. The touch display apparatus according to claim 8, further comprising a bank insulating layer on the substrate, the bank insulating layer covering an edge of the first emission electrode,
    wherein a portion of the first emission electrode exposed by the bank insulating layer has a same width or a substantially same width as the guide opening of the touch insulating layer.

* * * * *